United States Patent
Aizawa et al.

(10) Patent No.: US 10,594,287 B2
(45) Date of Patent: Mar. 17, 2020

(54) NOISE FILTER

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Takeshi Aizawa, Mie (JP); Yoshito Sakai, Mie (JP)

(73) Assignees: AutoNetworks Technologies, Ltd. (JP); Sumitomo Wiring Systems, Ltd. (JP); Sumitomo Electric Industries, Ltd. (JP)

( * ) Notice: Subject to any disclaimer, the term of this patent is extended or adjusted under 35 U.S.C. 154(b) by 0 days.

(21) Appl. No.: 16/080,757

(22) PCT Filed: Feb. 13, 2017

(86) PCT No.: PCT/JP2017/005069
§ 371 (c)(1),
(2) Date: Aug. 29, 2018

(87) PCT Pub. No.: WO2017/150152
PCT Pub. Date: Sep. 8, 2017

(65) Prior Publication Data
US 2019/0089322 A1 Mar. 21, 2019

(30) Foreign Application Priority Data
Mar. 4, 2016 (JP) .................. 2016-041916

(51) Int. Cl.
*H03H 7/01* (2006.01)
*H03H 1/00* (2006.01)
(Continued)

(52) U.S. Cl.
CPC .......... *H03H 7/0115* (2013.01); *H01F 27/02* (2013.01); *H01F 27/24* (2013.01); *H01F 27/28* (2013.01);
(Continued)

(58) Field of Classification Search
CPC ......... H03H 2001/0085; H03H 7/0115; H03H 2001/0057; H03H 1/0007
(Continued)

(56) References Cited

U.S. PATENT DOCUMENTS

| 4,752,752 A | 6/1988 | Okubo |
| 2015/0008989 A1* | 1/2015 | Aizawa ............... H03H 1/0007 333/185 |
| 2015/0296298 A1 | 10/2015 | Yamada |

FOREIGN PATENT DOCUMENTS

| JP | 62-135221 | 8/1987 |
| JP | 2009-290377 | 12/2009 |

(Continued)

OTHER PUBLICATIONS

International Search Report dated Mar. 28, 2017.

*Primary Examiner* — Rakesh B Patel
(74) *Attorney, Agent, or Firm* — Gerald E. Hespos; Michael J. Porco; Matthew T. Hespos

(57) ABSTRACT

A noise filter (A) includes a case (10) and capacitors (20) accommodated in the case (10). Substantially flat surfaces of the capacitors (20) serve as ground-side electrodes (23). A ground terminal (17) is connected directly to the ground-side electrodes (23), and input/output terminals (15) are connected to input/output-side electrodes (21) of the capacitors (20). A routing space for leads for connecting the capacitors (20) and the ground terminal (17) is not necessary in the case (10). Therefore, the case (10) can be miniaturized.

8 Claims, 4 Drawing Sheets

(51) Int. Cl.
  *H01F 27/02* (2006.01)
  *H01F 27/24* (2006.01)
  *H01F 27/28* (2006.01)
  *H01F 27/40* (2006.01)
  *H01G 4/224* (2006.01)
  *H01G 4/228* (2006.01)
  *H01G 4/40* (2006.01)
(52) U.S. Cl.
  CPC .............. *H01F 27/40* (2013.01); *H01G 4/224* (2013.01); *H01G 4/228* (2013.01); *H01G 4/40* (2013.01); *H03H 1/0007* (2013.01); *H03H 2001/005* (2013.01); *H03H 2001/0035* (2013.01); *H03H 2001/0057* (2013.01)
(58) Field of Classification Search
  USPC .................................................. 333/185, 175
  See application file for complete search history.

(56) References Cited

FOREIGN PATENT DOCUMENTS

| | | |
|---|---|---|
| JP | 2010-004341 | 1/2010 |
| JP | 2012-129631 | 7/2012 |
| JP | 2015-211310 | 11/2015 |

* cited by examiner

NOISE FILTER

BACKGROUND

Field of the Invention

The invention relates to a noise filter.

Related Art

Japanese Unexamined Patent Publication No. 2009-290377 discloses a π-type noise filter provided with two capacitors and one coil in a case. Out of two leads projecting from each capacitor is connected to an input/output terminal and the other lead is connected to a ground terminal.

The ground terminal and the capacitors of the above-described noise filter are connected via the leads. Thus, a large space is necessary in the case for routing the leads depending on the layout of the ground terminal and the capacitors. Thus, there is a problem of enlarging the noise filter.

The invention was completed on the basis of the above situation and aims to achieve miniaturization.

SUMMARY

A noise filter of the present invention includes a case and a capacitor accommodated in the case. A part of the outer surface of the capacitor is substantially flat and forms a ground-side electrode that is connected directly to a ground terminal. An input/output terminal is connected to an input/output-side electrode of the capacitor.

The case does not require a space for routing a lead for connecting the capacitor and the ground terminal. Accordingly, the case can be miniaturized.

The noise filter may include a lead provided on the capacitor and drawn out from the input/output-side electrode, and an electrical element may be formed by the lead. According to this configuration, the lead can function as a filter element, and a smaller number of components are necessary as compared to the case where a filter element separate from the capacitor is provided.

The input/output-side electrode may be a substantially flat surface exposed on the outer surface of the capacitor. A base end part of a busbar may be fixed to the input/output-side electrode, and a tip part of the busbar may function as the input/output terminal. According to this configuration, the input/output-side electrode and the busbar may be fixed and integrated before being accommodated into the case and can be mounted into the case by one action.

A magnetic core may be provided in a conductive path connecting the input/output-side electrode and the input/output terminal. According to this configuration, filter performance is improved as compared to the case where the filter element is constituted only by the capacitor.

DETAILED DESCRIPTION

Figure 1:
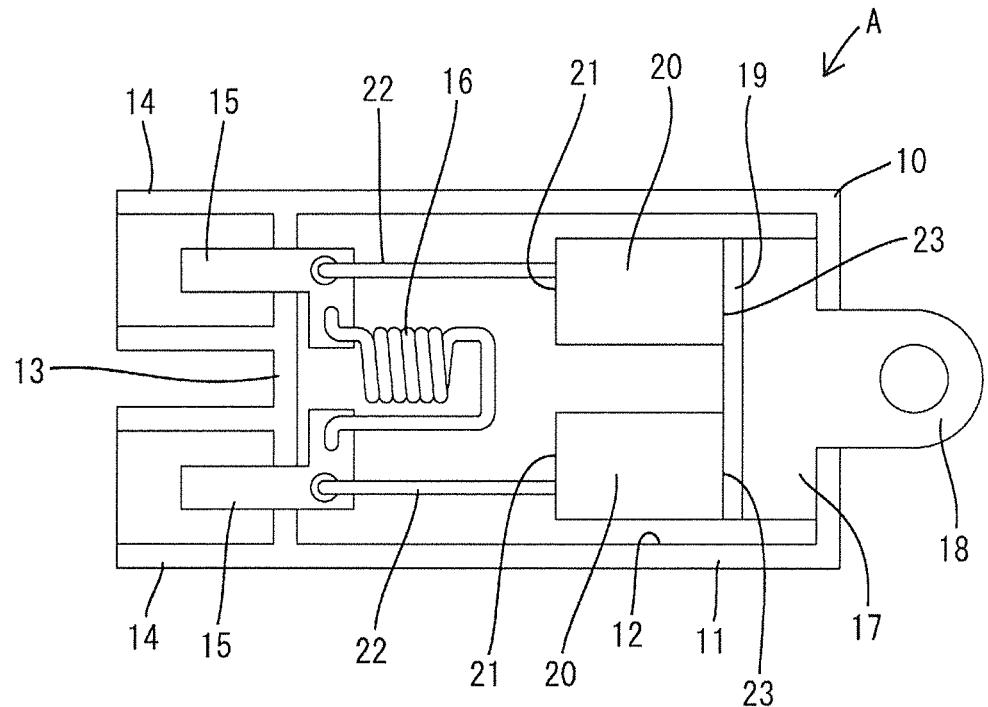
FIG. 1 is a plan view of a noise filter of a first embodiment.

A first embodiment of the invention is described below with reference to FIG. 1. A noise filter A of the first embodiment includes a case 10, two input/output terminals 15, one ground terminal 17 and two capacitors 20 and functions as a π-type filter. The case 10 is made of an insulating material, such as synthetic resin, and is composed of a body 11 whose interior serves as an accommodation space 12, and left and right receptacle-like fittings 14 project forward from a front wall 13 of the body 11.

The left and right input/output terminals 15 penetrate through the front wall 13 of the body 11 in a front-rear direction. One input/output terminal 15 serves as an input-side terminal and the other input/output terminal 15 serves as an output-side terminal. A front part of each input/output terminal 15 is accommodated in the fitting 14 and is connected to a wiring harness (not shown). A rear end part of each input/output terminal 15 is disposed in a front end part of the accommodation space 12. Both end parts of a coiled inductor 16 are connected to the rear end parts of the left and right input/output terminals 15 by soldering or the like.

The ground terminal 17 is mounted in a rear end part of the body 11. A rear end part of the ground terminal 17 is exposed outside and behind the body 11 and serves as a ground 18 for connection to a ground point (not shown). A front part of the ground terminal 17 is disposed in the accommodation space 12. A ground-side connecting portion 19 is formed on a front end edge part of the ground terminal 17 and defines a flat plate having a plate thickness direction oriented in the front-rear direction. This ground-side connecting portion 19 is connected to the two capacitors 20.

The two capacitors 20 are accommodated side by side in a lateral direction in the accommodation space 12. The front surface of each capacitor 20 serves as an input/output-side electrode 21. A lead 22 is drawn out forward from each input/output-side electrode 21. A front part of each lead 22 is connected to the rear end part of the input/output terminal 15 by soldering or the like.

The outer rear end surface of each capacitor 20 serves as a ground-side electrode 23 in the form of a flat surface. No lead is drawn out from the ground-side electrode 23. The ground-side electrodes 23 of the left and right capacitors 20 are connected directly and conductively in surface contact with the front surface of one ground-side connecting portion 19 formed on the ground terminal 17. A conductive adhesive (not shown) or a method such as low-temperature welding or fusion can be adopted for connecting the ground-side electrodes 23 and the ground terminal 17. Further, the ground-side connecting portion 19 of the ground terminal 17 may be formed with a resilient contact piece (not shown), and this resilient contact piece may be brought resiliently into contact with the ground-side electrodes 23.

The noise filter A of the first embodiment includes the case 10. The capacitors 20 are accommodated in the case 10 and have flat rear end surfaces (parts of outer surfaces) serving as the ground-side electrodes 23. The ground terminal 17 are connected directly to the ground-side electrodes 23, and the input/output terminals 15 are connected to the input/output-side electrodes 21 of the capacitors 20. According to this configuration, a routing space for the leads for connecting the capacitors 20 and the ground terminal 17 is not necessary, so that the case 10 can be miniaturized.

Figure 2:
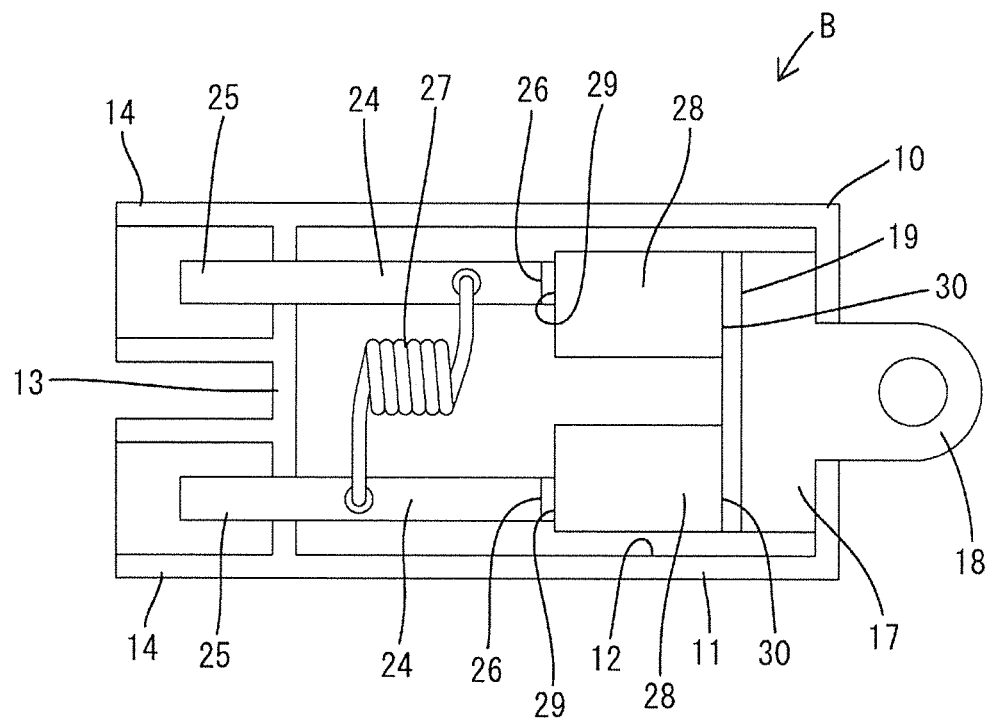
FIG. 2 is a plan view of a noise filter of a second embodiment.

A second embodiment of the invention is described with reference to FIG. 2. A noise filter B of the second embodiment functions as a π-type filter and differs from the first embodiment in input/output terminals 25, an inductor 27 and capacitors 28. Since the configurations of a case 10 and a ground terminal 17 are the same as in the first embodiment, the same components are denoted by the same reference signs. However, structures, functions and effects thereof are not described.

Two busbars 24 are mounted in the case 10 and are long and narrow in a front-rear direction. Front end parts of the left and right busbars 24 function as the input/output terminals 25, and penetrate through a front wall 13 of a body 11. The input/output terminal 25 of one busbar 24 serves as an input-side terminal and the input/output terminal 25 of the other busbar 24 serves as an output-side terminal. A front part of each input/output terminal 25 is accommodated in a fitting 14 and is connected to a wiring harness (not shown). A rear end of each of the left and right busbars 24 is formed with a terminal-side connecting portion 26 in the form of a flat plate having a plate thickness direction oriented in the front-rear direction. Both end parts of the coiled inductor 27 are connected to areas of the left and right busbars 24 between the input/output terminals 25 and the terminal-side connecting portions 26.

Two capacitors 28 are accommodated side by side in a lateral direction in an accommodation space 12. The front surface of each capacitor 20 is a flat surface that serves as an input/output-side electrode 29. No lead is drawn out from the input/output-side electrode 29. The rear surface of the terminal-side connecting portion 26 of each busbar 24 is connected directly and conductively in surface contact with the input/output-side electrode 29. A conductive adhesive (not shown) or a method such as low-temperature welding or fusion can be adopted for connecting the input/output-side electrodes 29 and the terminal-side connecting portions 26. Further, the ground-side connecting portion 26 may be formed with a resilient contact piece (not shown), and this resilient contact piece may be brought resiliently into contact with the input/output-side electrode 29.

The outer rear end surface of each capacitor 28 serves as a ground-side electrode 30. No lead is drawn out from the input/output-side electrode 29. The ground-side electrodes 30 of the left and right capacitors 28 are connected directly and conductively in surface contact with the front surface of one ground-side connecting portion 19. A conductive adhesive (not shown) or a method such as low-temperature welding or fusion can be adopted for connecting the ground-side electrodes 30 and the ground terminal 17. Further, the ground-side connecting portion may be formed with a resilient contact piece (not shown), and this resilient contact piece may be brought resiliently into contact with the ground-side electrodes 30.

The noise filter B of the second embodiment includes the case 10. The capacitors 28 are accommodated in the case 10 and have the substantially flat rear end surfaces (parts of outer surfaces) serving as the ground-side electrodes 30. The ground terminal 17 is connected directly to the ground-side electrodes 30, and the input/output terminals 25 connected to the input/output-side electrodes 29 of the capacitors 28. According to this configuration, a routing space for leads for connecting the capacitors 28 and the ground terminal 17 is not necessary in the case 10 so that the case 10 can be miniaturized.

Further, in the noise filter B, the input/output-side electrodes 29 are exposed substantially in the form of flat surfaces on the outer surfaces (front end surfaces) of the capacitors 28, base end parts (terminal-side connecting portions 26) of the busbars 24 are fixed to the input/output-side electrodes 29, and tip parts of the busbars 24 function as the input/output terminals 25. According to this configuration, if the input/output-side electrodes 29 of the capacitors 28 and the busbars 24 are fixed and integrated before being accommodated into the case 10, the capacitors 28 and the busbars 24 can be mounted into the case 10 by one action.

Figure 3:
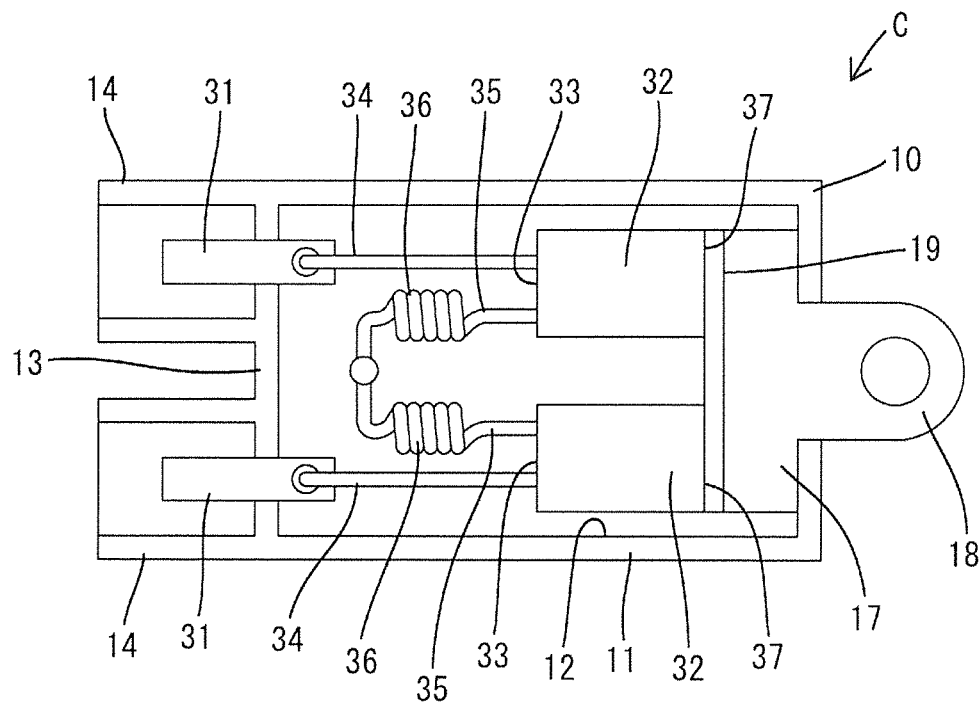
FIG. 3 is a plan view of a noise filter of a third embodiment.

A third embodiment of the invention is described with reference to FIG. 3. A noise filter C of the third embodiment functions as a π-type filter and differs from the first embodiment in input/output terminals 31, capacitors 32 and inductors 36 (electrical element as claimed). The configurations of a case 10 and a ground terminal 17 are the same as in the first embodiment. Thus, these same components are denoted by the same reference signs, and structures, functions and effects thereof are not described.

Left and right input/output terminals 31 penetrate through a front wall 13 of a body 11 in a front-rear direction. One input/output terminal 31 serves as an input-side terminal and the other input/output terminal 31 serves as an output-side terminal. A front part of each input/output terminal 31 is accommodated in a fitting and is connected to a wiring harness (not shown). A rear edge of each input/output terminal 31 is disposed in a front part of an accommodation space 12.

Two capacitors 32 are accommodated side by side in a lateral direction in the accommodation space 12. The front surface of each capacitor 32 serves as an input/output-side electrode 33. One terminal directly coupling lead 34 is drawn out forward from each input/output-side electrode 33. Front end parts of the two terminals directly coupling leads 34 are connected individually to rear parts of the input/output terminals 31 by soldering or the like.

One coil lead 35 is drawn out forward from the input/output-side electrode 33 of each capacitor 32 besides the terminal directly coupling lead 34. Tips of these two coil leads 35 are connected by soldering or the like. A spiral coiled inductor 36 is formed in an intermediate part of each coil lead 35. The inductors 36 are connected to the two input/output terminals 31 via the coil leads 35, the input/output-side electrodes 33 and the terminal directly coupling leads 34.

The outer rear surface of each capacitor 32 is flat and forms a ground-side electrode 37. No lead is drawn out from the ground-side electrode 37. The ground-side electrodes 37 of the left and right capacitors 32 are connected directly and conductively in surface contact with the front surface of one ground-side connecting portion 19. A conductive adhesive (not shown) or a method such as low-temperature welding or fusion can be adopted for connecting the ground-side electrodes 37 and the ground terminal 17. Further, the ground-side connecting portion of the ground terminal 17 may be formed with a resilient contact piece (not shown), and this resilient contact piece may resiliently contact the ground-side electrodes 37.

The noise filter C of the third embodiment includes the case, the capacitors 32 accommodated in the case and having flat rear surfaces forming the ground-side electrodes 37, the ground terminal 17 directly connected to the ground-side electrodes 37, and the input/output terminals 31 connected to the input/output-side electrodes 33 of the capacitors 32. According to this configuration, a routing space for leads for connecting the capacitors 32 and the ground terminal 17 is not necessary in the case so that the case can be miniaturized.

The capacitor 32 includes the coil lead 35 drawn out from the input/output-side electrode 33 and the coiled inductor 36 formed in the coil lead 35. According to this configuration, the inductor 36, as an electrical element formed in the coil lead 35 of the capacitor 32, functions as a filter element. Thus, a smaller number of components are necessary as compared to the case where the inductors 36 (filter elements) separate from the capacitors 32 are provided.

Figure 4:
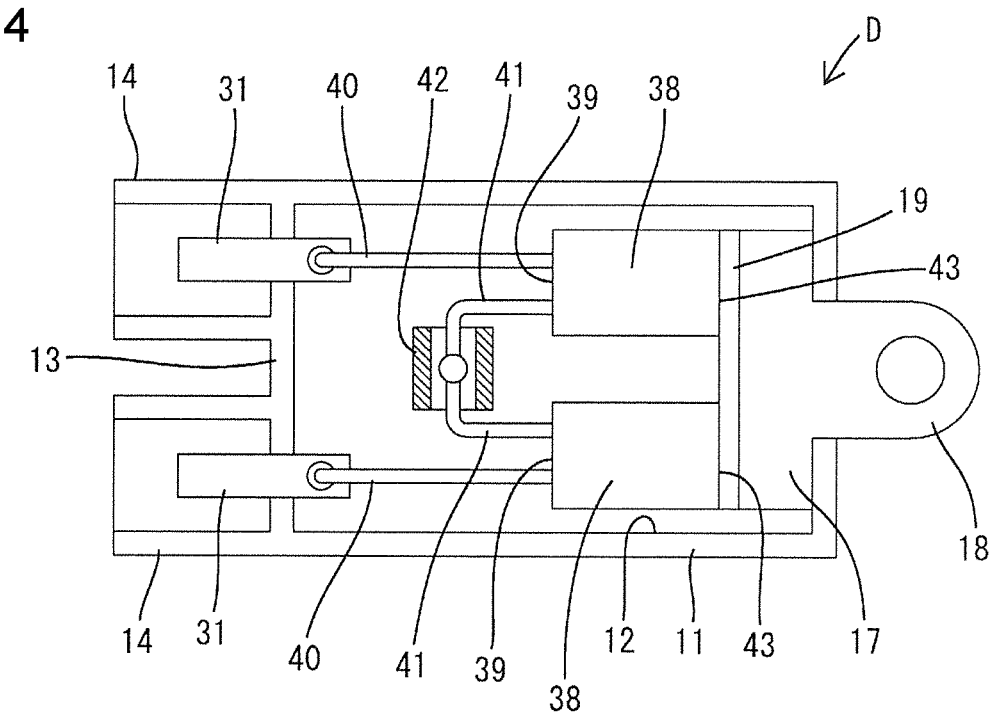
FIG. 4 is a plan view of a noise filter of a fourth embodiment.

A fourth embodiment of the invention is described with reference to FIG. 4. A noise filter D of the fourth embodiment differs from the first embodiment in capacitors 38 and an inductor. The configurations of a case 10, a ground terminal 17 and input/output terminals 31 are the same as in the third embodiment. Thus, the same components are denoted by the same reference signs, and structures, functions and effects thereof are not described.

Two capacitors 38 are accommodated side by side in a lateral direction in an accommodation space 12. The front end surface of each capacitor 38 serves as an input/output-side electrode 39. One terminal directly coupling lead 40 is drawn out forward from each input/output-side electrode 39. Front end parts of the two terminal directly coupling leads 40 are connected individually to rear end parts of a pair of input/output terminals by soldering or the like.

One shorting lead 41 (conductive path as claimed) is drawn out forward from the input/output-side electrode 39 of each capacitor 38 besides the terminal directly coupling lead 40. Tips of these two shorting leads 41 are connected by soldering or the like. A connected part of these two shorting leads 41 is surrounded by a ring-shaped magnetic core 42. The magnetic core 42 functions as a filter element. Since the noise filter D of the fourth embodiment includes the magnetic core 42, filter performance is improved as compared to the case where the filter element is constituted only by the capacitors 38.

The outer rear end surface of each capacitor 38 serves as a ground-side electrode 43 in the form of a flat surface. No lead is drawn out from the ground-side electrode 43. The ground-side electrodes 43 of the left and right capacitors 38 are connected directly and conductively in surface contact with the front surface of one ground-side connecting portion 19. A conductive adhesive (not shown) or a method such as low-temperature welding or fusion can be adopted for connecting the ground-side electrodes 43 and the ground terminal 17. Further, the ground-side connecting portion 19 of the ground terminal 17 may be formed with a resilient contact piece (not shown), and this resilient contact piece may be brought resiliently into contact with the ground-side electrodes 43.

The noise filter D of the fourth embodiment includes the case 10, the capacitors 38 accommodated in the case 10, the ground terminal 17 directly connected to the ground-side electrodes 43, and the input/output terminals 31 connected to the input/output-side electrodes 39 of the capacitors 38. The capacitors 38 accommodated in the case 10 have flat rear end surfaces that functions as the ground-side electrodes 43. According to this configuration, a routing space for leads for connecting the capacitors 38 and the ground terminal 17 is not necessary in the case 10. Therefore the case 10 can be miniaturized.

Figure 5:
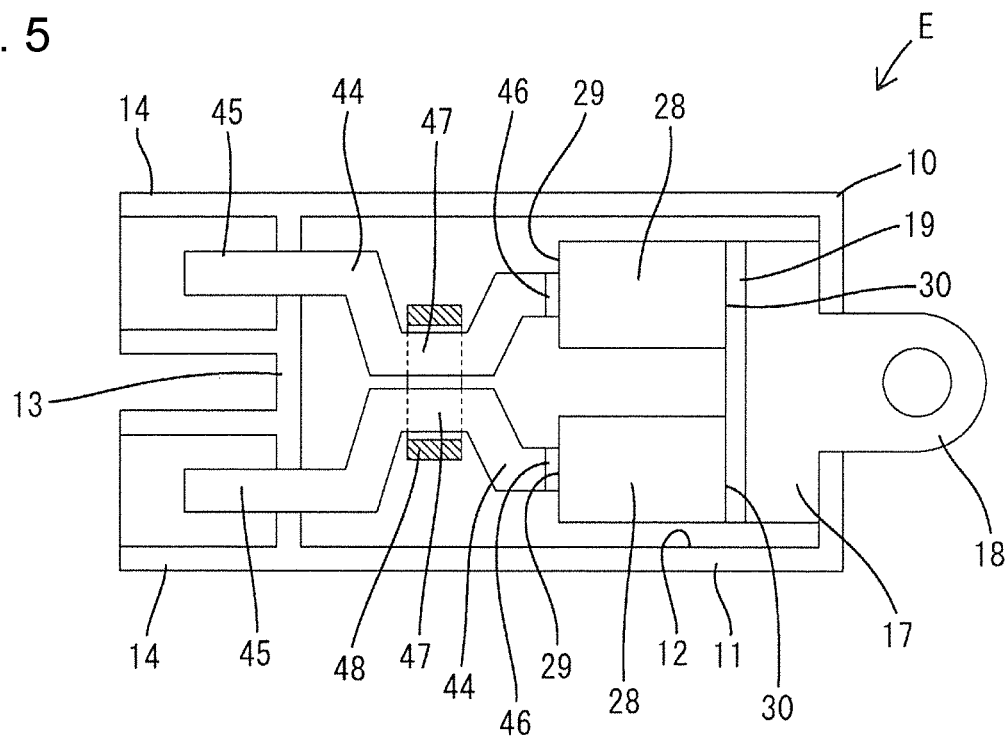
FIG. 5 is a plan view of a noise filter of a fifth embodiment.

A fifth embodiment of the invention is described with reference to FIG. 5. A noise filter E of the fifth embodiment differs from the second embodiment in busbars 44 and input/output terminals 45. The configurations of a case 10, a ground terminal 17 and capacitors 28 are the same as in the second embodiment. These same components are denoted by the same reference signs, and structures, functions and effects thereof are not described.

Left and right busbars 44 (conductive path as claimed) are mounted in the case 10. A front part of each busbar 44 functions as the input-output terminal 45 and penetrates through a front wall 13 of a body 11. The input/output terminal 45 of one busbar 44 serves as an input-side terminal, and the input/output terminal 45 of the other busbar 44 serves as an output-side terminal. A front end part of each input/output terminal 45 is accommodated in a fitting 14 and connected to a wiring harness (not shown). A terminal-side connecting portion 46 in the form of a flat plate and having a plate thickness direction oriented in a front-rear direction is formed on a rear end part of each of the both left and right busbars 44.

The rear surfaces of the terminal-side connecting portions 46 of the busbars 44 are connected respectively directly and conductively in surface contact with input/output-side electrodes 29 of the two capacitors 28. A conductive adhesive (not shown) or a method such as low-temperature welding or fusion can be adopted for connecting the input/output-side electrodes 29 and the terminal-side connecting portions 46. Further, the ground-side connecting portion 46 may be formed with a resilient contact piece (not shown), and this resilient contact piece may be brought resiliently into contact with the ground terminal 30.

Substantially central parts of the left and right busbars 44 in a length direction serve as proximate portions 47 and are bent into a substantially trapezoidal shape to approach the mating busbars 47. The proximate portions 47 are surrounded by a ring-shaped magnetic core 48. The magnetic core 48 functions as a filter element. The magnetic core 48 is provided around the busbars 44 connecting the input/output-side electrodes 29 and the input/output terminals 45 in the noise filter E of the fifth embodiment as just described. Thus, filter performance is excellent as compared to the case where the filter element is constituted only by the capacitors 28.

The noise filter E of the fifth embodiment includes the case 10, the capacitors 28 accommodated in the case 10, the ground terminal 17 directly connected to the ground-side electrodes 30, and the input/output terminals 45 connected to the input/output-side electrodes 29 of the capacitors 28. The capacitors 28 have flat rear end surfaces serving as the ground-side electrodes 30. According to this configuration, a routing space for leads for connecting the capacitors 28 and the ground terminal 17 is not necessary in the case 10 so that the case 10 can be miniaturized.

Further, in the noise filter E, the input/output-side electrodes 29 are exposed substantially in the form of flat surfaces on the outer surfaces (front end surfaces) of the capacitors 28. Base end parts (terminal-side connecting portions 46) of the busbars 44 are fixed to the input/output-side electrodes 29, and tips of the busbars 44 function as the input/output terminals 45. According to this configuration, if the input/output-side electrodes 29 of the capacitors 28 and the busbars 44 are fixed and integrated before being accommodated into the case 10, the capacitors 28 and the busbars 44 can be mounted into the case 10 by one action.

Figure 6:
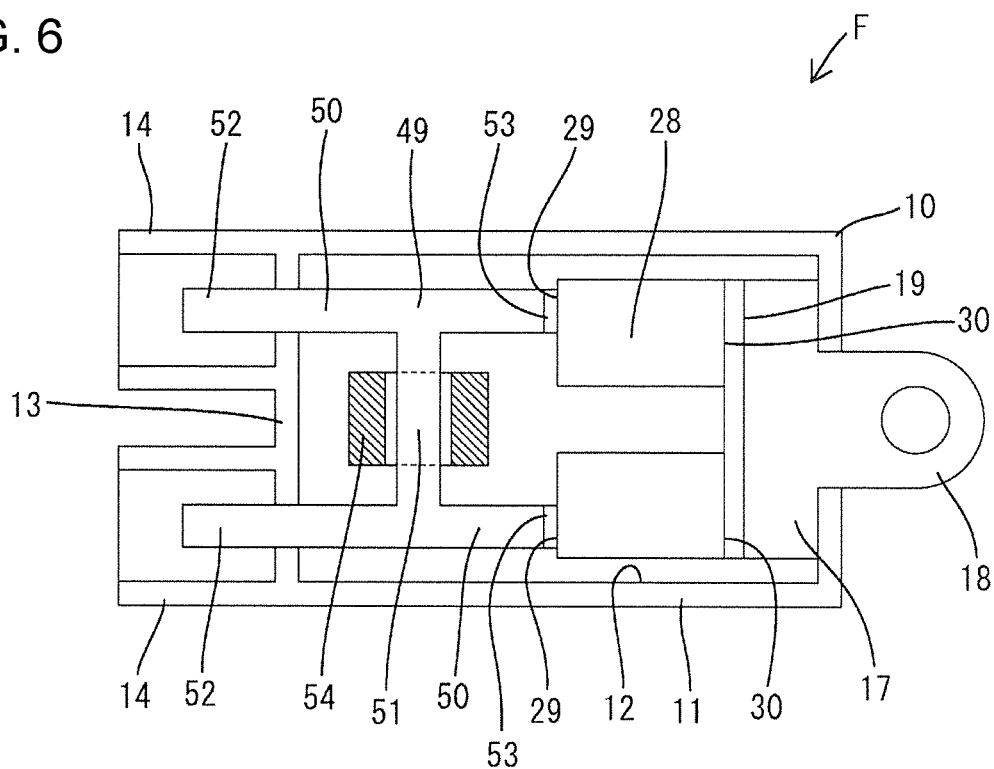
FIG. 6 is a plan view of a noise filter of a sixth embodiment.

A sixth specific embodiment of the invention is described with reference to FIG. 6. A noise filter F of the sixth embodiment differs from the second and fifth embodiments in input/output terminals 52 and a busbar 49. The configurations of a case 10, a ground terminal 17 and capacitors 28 are the same as in the second and fifth embodiments. These same components are denoted by the same reference signs, and structures, functions and effects thereof are not described.

The busbar 49 (conductive path as claimed) is mounted in the case 10 and is H-shaped in a plan view. The busbar 49 is a single component with left and right terminal function portions 50 that are long and narrow in a front-rear direction and a coupling 51 that couples substantially central parts of the left and right terminal function portions 50 in a length direction. A front end part of each terminal function portion 50 functions as an input-output terminal 52 and is mounted to penetrate through a front wall 13 of a body 11. The input/output terminal 52 of one busbar 49 serves as an input-side terminal, and the input/output terminal 52 of the other busbar 49 serves as an output-side terminal. A front part of each input/output terminal 52 is accommodated in a fitting 14 and connected to a wiring harness (not shown). A terminal-side connecting portion 53 is formed on a rear end part of each of the left and right terminal function portions 50 and is a flat plate having a plate thickness direction oriented in the front-rear direction.

The rear surfaces of the terminal-side connecting portions 53 of the busbar 49 are connected directly and conductively in surface contact with respective input/output-side electrodes 29 of the two capacitors 28. A conductive adhesive (not shown) or a method such as low-temperature welding or fusion can be adopted for connecting the input/output-side electrodes 29 and the terminal-side connecting portions 53. Further, the terminal-side connecting portion 53 may be formed with a resilient contact piece (not shown), and this resilient contact piece may be brought resiliently into contact with the input/output-side electrode 29.

The coupling 51 is surrounded by a ring-shaped magnetic core 54 that functions as a filter. The magnetic core 54 is provided around the busbar 49 that connects the input/output-side electrodes 29 and the input/output terminals 52 in the noise filter F of the sixth embodiment as just described. Thus, filter performance is excellent as compared to the case where the filter is constituted only by the capacitors 28.

The noise filter F of the sixth embodiment includes the case 10, the capacitors 28 accommodated in the case 10 and having the substantially flat rear end surfaces (parts of outer surfaces) serving as ground-side electrodes substantially, the ground terminal 17 directly connected to the ground-side electrodes, and the input/output terminals 52 connected to the input/output-side electrodes 29 of the capacitors 28. According to this configuration, a routing space for leads for connecting the capacitors 28 and the ground terminal 17 is not necessary in the case 10, and the case 10 can be miniaturized.

Further, in the noise filter F, the input/output-side electrodes 29 are exposed substantially in the form of flat surfaces on the outer surfaces (front end surfaces) of the capacitors 28, base end parts (terminal-side connecting portions 53) of the busbar 49 are fixed to the input/output-side electrodes 29, and tips of the busbar 49 function as the input/output terminals 52. According to this configuration, if the input/output-side electrodes 29 of the capacitors 28 and the busbar 49 are fixed and integrated before being accommodated into the case 10, the capacitors 28 and the busbar 49 can be mounted into the case 10 by one action.

Figure 7:
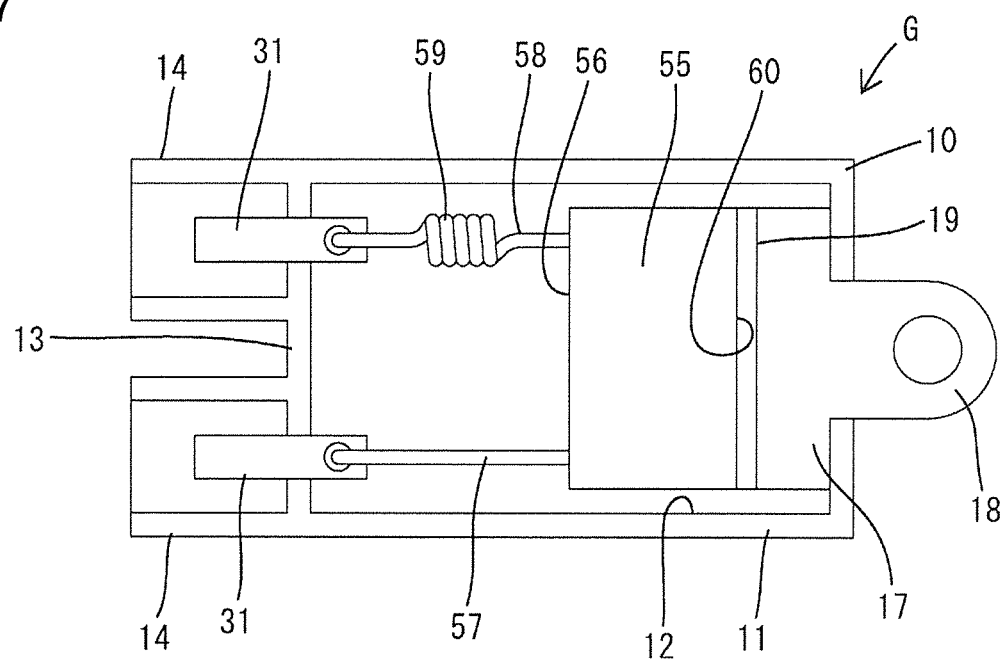
FIG. 7 is a plan view of a noise filter of a seventh embodiment.

A seventh embodiment of the invention is described with reference to FIG. 7. A noise filter G of the seventh embodiment functions as an L-type filter and differs from the third and fourth embodiments in a capacitor 55 and an inductor 59 (electrical element as claimed). The configurations of a case 10, input/output terminals 31 and a ground terminal 17 are the same as in the third and fourth embodiments. Thus, these same components are denoted by the same reference signs, and structures, functions and effects thereof are not described.

One capacitor 55 is accommodated in an accommodation space. The front end surface of the capacitor 55 serves as an input/output-side electrode 56. One terminal directly coupling lead 57 is drawn out forward from the input/output-side electrode 56. A front part of the terminal directly coupling lead 57 is connected to a rear end part of one of left and right input/output terminals 31 by soldering or the like.

One coil lead 58 is drawn out forward from the input/output-side electrode 56 of the capacitor 55 beside the terminal directly coupling lead 57. A tip of this coil lead 58 is connected to a rear part of the other of the left and right input/output terminals 31 by soldering or the like. The spiral (coiled) inductor 59 is formed in an intermediate part of each coil lead 58.

The outer rear end surface of the capacitor 55 serves as a ground-side electrode 60 in the form of a flat surface. No lead is drawn out from the ground-side electrode 60. The ground-side electrode 60 is connected directly and conductively in surface contact with the front surface of a ground-side connecting portion 19 formed on the ground terminal 17. A conductive adhesive (not shown) or a method such as low-temperature welding or fusion can be adopted for connecting the ground-side electrode 60 and the ground terminal 17. Further, the ground-side connecting portion 19 of the ground terminal 17 may be formed with a resilient contact piece (not shown), and this resilient contact piece may be brought resiliently into contact with the ground-side electrode 60.

The noise filter G of the seventh embodiment includes the case 10, the capacitor 55 accommodated in the case 10 and having the substantially flat rear end surface (part of an outer surface) serving as the ground-side electrode 60, the ground terminal 17 directly connected to the ground-side electrode 60, and the input/output terminals 31 connected to the input/output-side electrode 56 of the capacitor 55. According to this configuration, a routing space for a lead for connecting the capacitor 55 and the ground terminal 17 is not necessary in the case 10, so that the case 10 can be miniaturized.

Further, the capacitor 55 includes the coil lead 58 drawn out from the input/output-side electrode 56 and the coiled inductor 59 formed in the coil lead 58. According to this configuration, the inductor 59 is an electrical element formed in the coil lead 58 of the capacitor 55 and functions as a filter element. Thus, a smaller number of components are necessary as compared to the case where the inductor 59 (filter element) separate from the capacitor 55 is provided.

Figure 8:
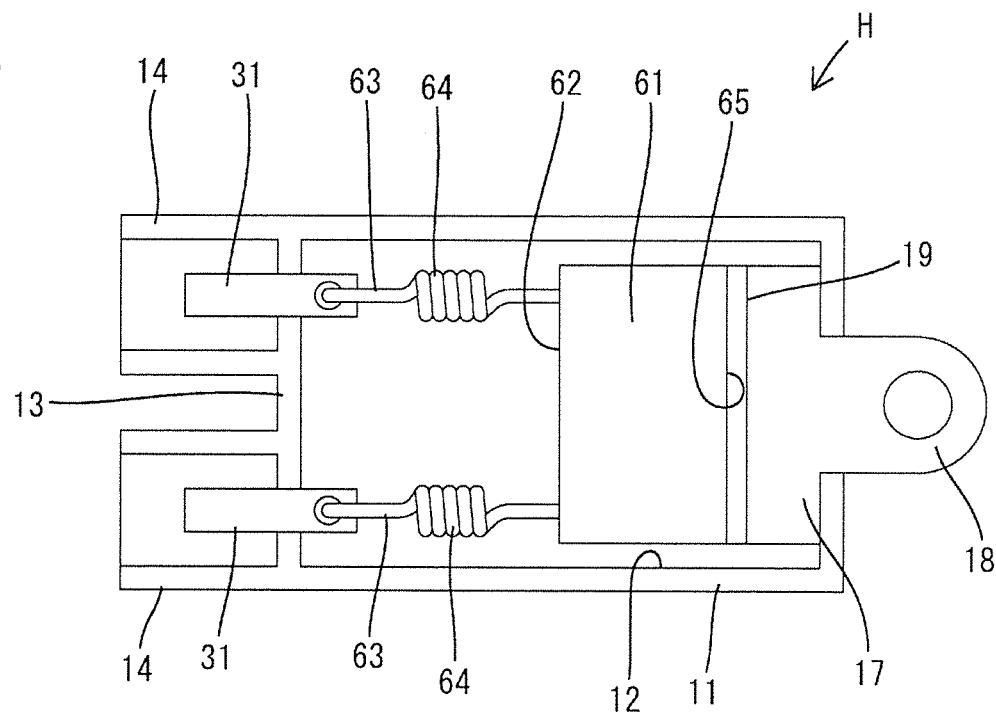
FIG. 8 is a plan view of a noise filter of an eighth embodiment.

An eighth embodiment of the invention is described with reference to FIG. 8. A noise filter H of the eighth embodiment functions as a T-type filter and differs from the seventh embodiment in a capacitor 61 and inductors 64. The configurations of a case 10, input/output terminals 31 and a ground terminal 17 are the same as in the seventh embodiment. These same components are denoted by the same reference signs, and structures, functions and effects thereof are not described.

One capacitor 61 is accommodated in an accommodation space 12. The front surface of the capacitor 61 serves as an input/output-side electrode 62, and two coil leads 63 are drawn out forward from the input/output-side electrode 62. Front end parts of the two coil leads 63 are connected individually to rear end parts of a pair of left and right input/output terminals 31 by soldering or the like. Spiral (coiled) inductors 64 are formed in intermediate parts of the both left and right coil leads 63.

The outer rear end surface of the capacitor 61 serves as a ground-side electrode 65 in the form of a flat surface. No lead is drawn out from the ground-side electrode 65. The ground-side electrode 65 is connected directly and conductively in surface contact with the front surface of a ground-side connecting portion 19 on the ground terminal 17. A conductive adhesive (not shown) or a method such as low-temperature welding or fusion can be adopted for connecting the ground-side electrode 65 and the ground terminal 17. Further, the ground-side connecting portion 19 of the ground terminal 17 may be formed with a resilient contact piece (not shown), and this resilient contact piece may be brought resiliently into contact with the ground-side electrode 65.

The noise filter H of the eighth embodiment includes the case 10, the capacitor 61 accommodated in the case 10 and having the substantially flat rear end surface (part of an outer surface) serving as the ground-side electrode 6, the ground terminal 17 directly connected to the ground-side electrode 65, and the input/output terminals 31 connected to the input/output-side electrode 62 of the capacitor 61. According to this configuration, a routing space for a lead for connecting the capacitor 61 and the ground terminal 17 is not necessary in the case, and therefore the case 10 can be miniaturized.

Further, the capacitor 61 includes the two coil leads 63 drawn out from the input/output-side electrode 62 and the coiled inductors 64 respectively formed in the two coil leads 63. According to this configuration, the inductors 64 formed as electrical elements in the coil leads 63 of the capacitor 61 function as filter elements. Thus, a smaller number of components are necessary as compared to the case where the inductors 64 (filter elements) separate from the capacitor 61 are provided.

The invention is not limited to the above described and illustrated embodiments. For example, the following embodiments also are included in the scope of the invention.

Although the inductor (electrical element) is wound into a coil in the first, second, third, seventh and eighth embodiments, the inductor (electrical element) may be wound spirally on the same plane.

Although functions as the inductor (electrical element) are exhibited by something wound into a coil in the first, second, third, seventh and eighth embodiments, a coil having a magnetic core arranged inside or a wire material spirally wound on the same plane and having a magnetic core arranged in a central part may function as the inductor (electrical element).

(3) Although the electrical element formed by the lead of the capacitor is the inductor in the third, seventh and eighth embodiments, the electrical element formed by the lead may be a known winding resistance.

LIST OF REFERENCE SIGNS

A, B, C, D, E, F, G, H . . . noise filter
10 . . . case
15, 25, 31, 45, 52 . . . input/output terminal
27 . . . ground terminal
20, 28, 32, 38, 55, 61 . . . capacitor
21, 29, 33, 39, 56 . . . input/output-side electrode
23, 30, 60, 65 . . . ground-side electrode
24 . . . busbar
35, 58 . . . coil lead (lead)
36, 59 . . . inductor (electrical element)
41 . . . shorting lead (conductive path)
42, 48, 54 . . . magnetic core
44, 49 . . . busbar (conductive path)

The invention claimed is:

1. A noise filter, comprising:
a case having opposite front and rear ends spaced apart in a front-rear direction, a fitting defining a receptacle open at the front end of the case;
a capacitor accommodated in the case, a first part of an outer surface of the capacitor defining a ground-side electrode substantially in the form of a first flat surface facing toward the rear end of the case, a second part of the outer surface of the capacitor defining an input/output-side electrode substantially in the form of a second flat surface facing toward the front end of the case;
a ground terminal formed with a ground-side connecting portion defining a flat plate having a plate thickness direction oriented in the front-rear direction and connected directly to the ground-side electrode inside the case, the ground terminal further having a ground function portion projecting outside through the rear end of the case and functioning as a connection means to a ground point; and
an input/output terminal having a rear end disposed in the case and connected to the input/output-side electrode of the capacitor and further having a front end projecting through the case and into the receptacle.

2. The noise filter of claim 1, comprising:
a lead extending from the input/output-side electrode of the capacitor and extending to the rear end of the input/output terminal.

3. The noise filter of claim 1, wherein:
the input/output terminal is a busbar, a base end part of the busbar being formed as a flat plate having a plate thickness direction oriented in the front-rear direction and being fixed directly to the input/output-side electrode; and
a tip part at a front end of the busbar projecting through the case and into the receptacle.

4. The noise filter of claim 1, wherein a magnetic core is provided in a conductive path connecting the input/output-side electrode and the input/output terminal.

5. A noise filter, comprising:
a case;
a capacitor accommodated in the case, a first part of an outer surface of the capacitor defining a ground-side electrode substantially in the form of a first flat surface, a second part of the outer surface of the capacitor defining an input/output-side electrode exposed substantially in the form of a second flat surface;
a ground terminal formed with a ground-side connecting portion to be connected directly to the ground-side electrode of the capacitor inside the case, and the ground terminal further formed with a ground function portion projecting outside of the case and functioning as a connection means to a ground point; and
a busbar having a base end part fixed to the input/output-side electrode and further having a tip part that functions as an input/output terminal, and wherein a magnetic core is provided in a conductive path connecting the input/output-side electrode and the input/output terminal.

6. A noise filter, comprising:

a case having opposite front and rear ends spaced apart in a front-rear direction, first and second fittings defining first and second receptacles open at the front end of the case;

first and second capacitors accommodated in the case, a first part of an outer surface of each of the capacitors defining a ground-side electrode substantially in the form of a rearwardly facing flat surface, a second part of the outer surface of each of the capacitors defining an input/output-side electrode substantially in the form of a forwardly facing flat surface;

a ground terminal formed with a ground-side connecting portion defining a flat plate having a plate thickness direction oriented in the front-rear direction and connected directly to both of the ground-side electrodes inside the case, the ground terminal further having a ground function portion projecting outside through the rear end of the case and functioning as a connection means to a ground point; and first and second input/output terminals having rear ends disposed in the case and connected to the input/output-side electrode of the respective capacitors and further having front ends projecting through the case and into the respective first and second receptacles.

7. The noise filter of claim 6, wherein:

the first and second input/output terminals are first and second busbars, a base end part of each of the busbars being formed as a flat plate having a plate thickness direction oriented in the front-rear direction and being fixed directly to the respective input/output-side electrode; and a tip part at a front end of each of the busbars projecting through the case and into the respective first and second receptacles.

8. The noise filter of claim 6, wherein a magnetic core is provided in a conductive path connecting the input/output-side electrodes and the input/output terminals.

* * * * *